(12) United States Patent
Schoenborn

(10) Patent No.: US 7,155,352 B2
(45) Date of Patent: Dec. 26, 2006

(54) USING FEEDBACK TO SELECT TRANSMITTING VOLTAGE

(75) Inventor: Theodore Z. Schoenborn, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 363 days.

(21) Appl. No.: 10/750,259

(22) Filed: Dec. 31, 2003

(65) Prior Publication Data

US 2005/0146829 A1   Jul. 7, 2005

(51) Int. Cl.
*G06F 19/00* (2006.01)

(52) U.S. Cl. .......................................... 702/64; 438/17

(58) Field of Classification Search .................. 702/64, 702/65, 182–185; 438/17
See application file for complete search history.

(56) References Cited

U.S. PATENT DOCUMENTS

| 5,563,928 | A | * | 10/1996 | Rostoker et al. ............... 377/20 |
| 5,648,972 | A | | 7/1997 | Gharakhanian |
| 6,546,343 | B1 | | 4/2003 | Batra et al. |
| 6,825,693 | B1 | | 11/2004 | Schoenborn et al. |
| 6,906,549 | B1 | | 6/2005 | Schoenborn et al. |
| 2004/0128595 | A1 | | 7/2004 | Schoenborn et al. |
| 2004/0184409 | A1 | | 9/2004 | Schoenborn et al. |

OTHER PUBLICATIONS

PCT International Search Report, PCT/US2004/043652 (PI8032PCT).
PCT Written Opinion of International Searching Authority PCT/US2004/043652 (PI8032PCT).
Serial ATA: High Speed Serialized AT Attachment, Revision 1.0, Aug. 29, 2001, coversheet and pp. 1-7, 97-116, 143-145, and 190-192.
InfinibandTM Architecture Specification vol. 1, release 1.0, Oct. 24, 2000, Final, coversheet and pp. 2-25 and 790-812.

* cited by examiner

*Primary Examiner*—Edward Raymond
(74) *Attorney, Agent, or Firm*—Philip A. Pedigo

(57) ABSTRACT

In some embodiments, a chip includes transmitters to provide transmit signals to chip interfaces and voltage control circuitry to control voltages of the transmit signals. The chip further includes receivers to receive external signals from another chip. The chip also includes evaluation circuitry to determine whether the transmit signals were usable by the other chip based on an evaluation of at least one of the received external signals and to provide a usability indicating signal to the voltage control circuitry indicative of whether the transmit signals were usable by the other chip. Other embodiments are described and claimed.

26 Claims, 8 Drawing Sheets

US 7,155,352 B2

USING FEEDBACK TO SELECT TRANSMITTING VOLTAGE

BACKGROUND

1. Technical Field

The present inventions relate to an integrated circuit chip and, more particularly, to a chip that uses at least one external feedback signal to select a transmitting voltage.

2. Background Art

Many chips are designed to provide output transmit signals at voltages that are chosen for worst case situations. Since worst case situations usual do not occur, these chips use more power than is needed.

Some chips are designed to operate at more than one voltage. For example, a mobile computer chip may operate at one voltage when its power is supplied from an external source and a lesser voltage when the power is supplied from a battery. However, the two voltages are pre-selected.

Loopback refers to a process wherein a first chip transmits signals to a second chip and the second chip retransmits the signals back to the first chip. Loopback is used in analog and digital validation, test, and debug.

Various techniques have been developed for chips to communicate with each other. The techniques include those that have been standardized and those that have not been standardized. An example of standardized techniques include versions of the Peripheral Chip Interconnect (PCI) Local Bus Specification, such as a PCI Local Bus Specification rev. 2.2, dated Dec. 18, 1998, by the PCI Special Interest Group (SIG). A PCI Express specification, formerly known as 3GIO ($3^{rd}$ generation input output), is being defined by the PCI SIG. A PCI Express Base Specification Revision 1.0, Jul. 22, 2002, has been released and is available with the payment of a fee. An Errata dated Oct. 7, 2003 has been published.

Signals are often applied differentially on two interconnects. The term "common mode" refers to the average voltage on the interconnects. Systems have used capacitors in series with interconnects to pass the difference between signals on the two interconnects, but not the common mode under ordinary operation. The 8b/10b code is a commonly used code in serial links.

BRIEF DESCRIPTION OF THE DRAWINGS

The inventions will be understood more fully from the detailed description given below and from the accompanying drawings of embodiments of the inventions which, however, should not be taken to limit the inventions to the specific embodiments described, but are for explanation and understanding only.

DETAILED DESCRIPTION

Figure 1:
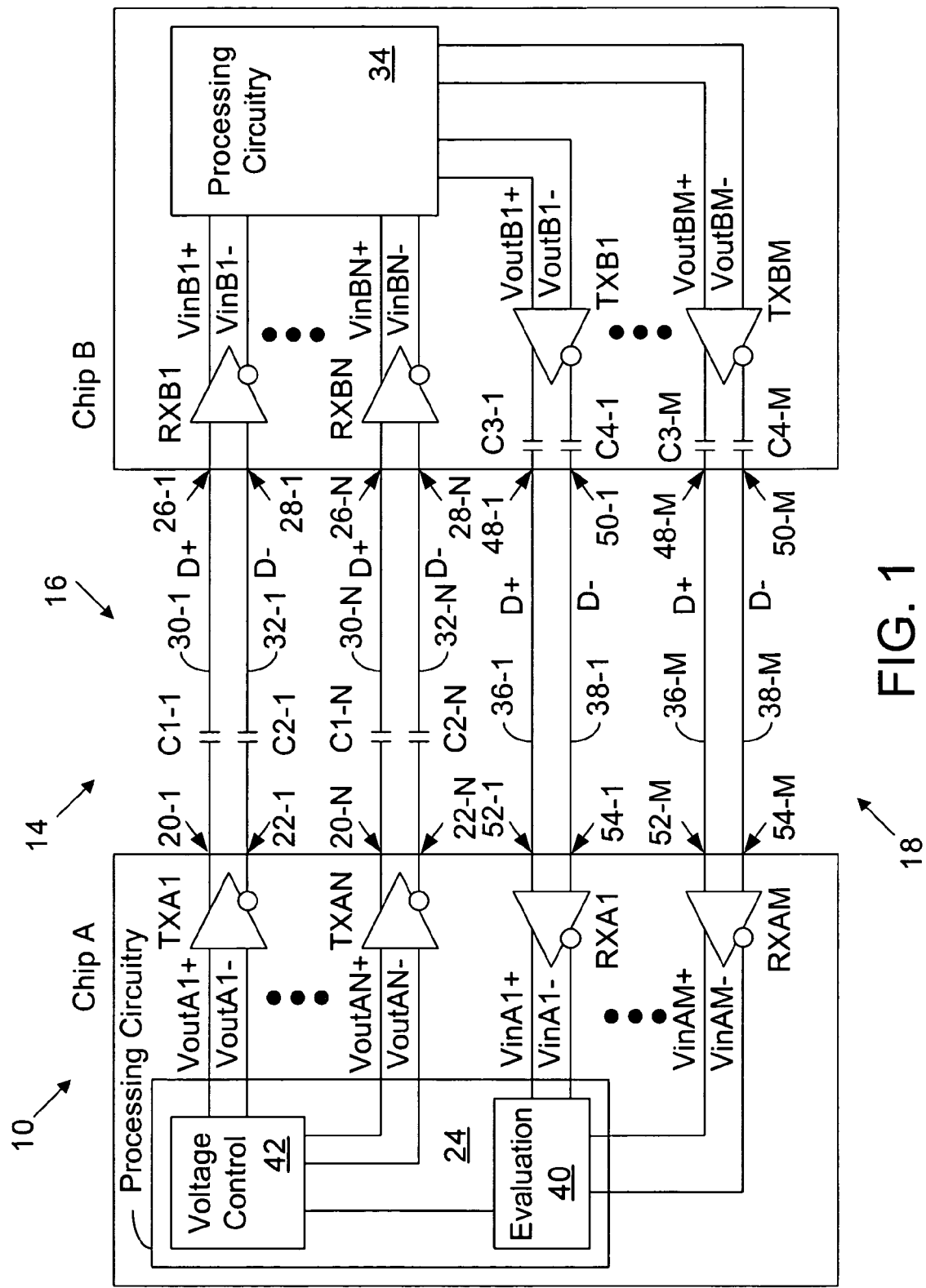
FIG. 1 is a schematic block diagram representation of a system according to some embodiments of the inventions.

FIG. 1 illustrates a system 10 having a first chip (chip A) and a second chip (chip B) coupled through a link 14. Link 14 includes interconnects 16 (interconnects 30-1, 32-1 . . . 30-N, 32-N) and interconnects 18 (interconnects 36-1, 38-1 . . . 36-M, 38-M). Processing circuitry 24 in chip A includes evaluation circuitry 40 and voltage control circuitry 42. Voltage control circuitry 42 provides signals VoutA1+, VoutA1− . . . VoutAN+, VoutAN− to transmitters TXA1 . . . TXAN which transmit these as differential transmit signals D+ and D− on interconnects 16 (30-1, 32-1 . . . 30-N, 32-N). Receivers RXB1 . . . RXBN in chip B provide the corresponding received signals VinB1+, VinB1− . . . VinBN+, VinBN− to processing circuitry 34.

As explained below, evaluation circuitry 40 uses at least one feedback signal from chip B to determine whether one or more transmit signals on one or more of interconnects 16 was usable by chip B. Evaluation circuitry 40 provides a usability indicating signal to voltage control circuitry 42. Voltage control circuitry 42 uses the usability indicating signal in determining how low the voltage of the transmit signals can be and still be usable by chip B. A usable transmit signal is one that chip B will interpret to have the values that chip A intended that it have. A reason to provide a lower voltage is to consume a smaller amount of power. As used herein, the term initiation is intended to be interpreted broadly rather than to have a specialized many as it may in some contexts. Various other activities may be performed in initiation mode. The same interconnects may be used for initiation and normal operating modes.

The chips may operate in an initiation mode in which chip A determines a usable voltage for the transmit signals. In some embodiments, during initiation mode, chip A determines the lowest available transmit signal voltage that is usable by chip B. Following the initiation mode, in an ordinary operation mode, chip A transmits the transmit signals to chip B at this lowest usable transmit signal voltage. However, in other embodiments, chip A may choose to send the transmit signals at greater than the lowest available usable voltage (for example, to be more conservative). In some embodiments, for whatever reason, chip A may decide not to go below a certain voltage even if lower voltages are available.

In some embodiments, the chips may switch back from normal operating mode to at least some activities of the initiation mode. The switch back to initiation mode may be at regular intervals. The switch may also be made in response to changing circumstances such as a temperature of chip A or B exceeding a threshold, or a change in the power source (for example, battery rather than external). The switch may also be made in response to a large number of retry requests from chip B to chip A (discussed below). The initiation mode can also be entered when the chip first gets power or is reset. Chip A can let chip B know chip A is an the initiation mode through a command on interconnects 16 or through other techniques.

In ordinary operation mode, processing circuitry 34 of chip B uses the received signals VinB1+, VinB1− . . . VinBN+, VinBN− to perform various functions depending on the particular implementation. One of the functions of processing circuitry 34 is to provide transmit signals VoutB1+, VoutB1− . . . VoutBM+, VoutBM− to transmitters TXB1 . . . TXBM for transmission through interconnects 18 to receivers RXA1 . . . RXAM of chip A. (Note that M may equal N or be different than N.) Transmit signals VoutB1+, VoutB1− . . . VoutBM+, VoutBM− may be the result of calculations performed by processing circuitry 34 or they may originate from other circuits in chip B, from chip A, or from another chip not shown in FIG. 1.

Signals VoutB1+, VoutB1+ . . . VoutBM+, VoutBM− are referred to as external signals when they pass over conductors 36-1, 38-1 . . . 36-M, 38-M. Signals VinA1+, VinA1− . . . VinAM+, VinAM− are referred to as received external signals. In FIG. 1, evaluation circuitry 40 receives at least some of the received external signals and determines whether one or more of the transmit signals on one or more of interconnects 16 was usable by chip B. Some of the various approaches to determining whether the transmit signals are usable are discussed below. In at least ordinary operation mode, some or all of the received external signals are used for other purposes (not shown in FIG. 1) and might or might not pass through evaluation circuitry 40.

Evaluation circuitry 40 provides a usability indicating signal to voltage control circuitry 42 indicating whether the transmit signals were determined by evaluation circuitry 40 to be usable by chip B. In response to the results (and considering available voltages), voltage control circuitry 42 may send subsequent transmit signals at the same voltage, send subsequent transmit signals at a higher voltage, or send subsequent transmit signals at a lower voltage.

Figure 2:
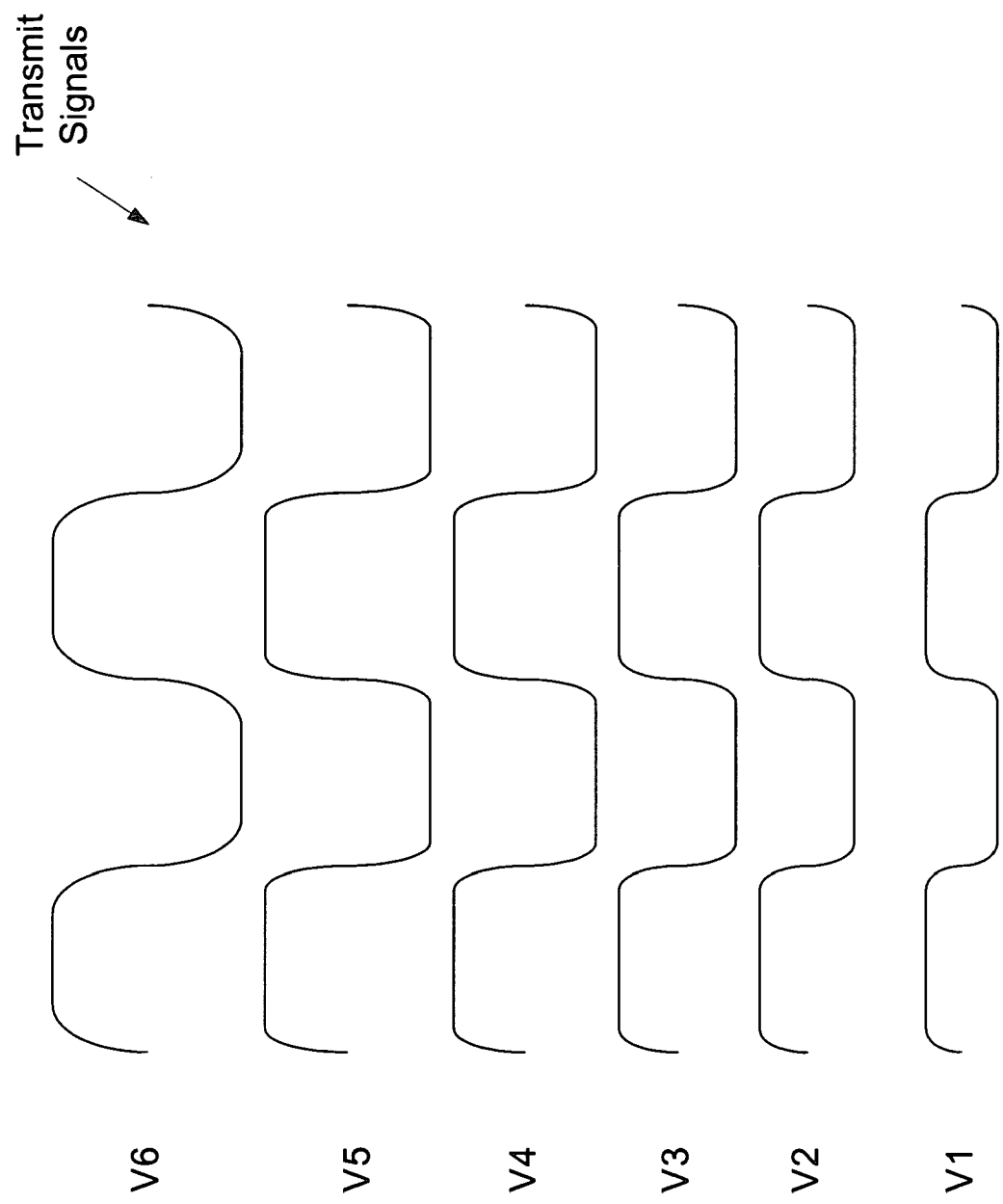
FIG. 2 illustrates representative transmit signals having different voltages.

FIG. 2 illustrates examples of the transmit signals on interconnects 16 having six different voltages V1–V6 where V1<V2<V3<V4<V5<V6. In different embodiments, the number of possible voltages may be more or less than the six illustrated in FIG. 2. The shape of signals in FIG. 2 is merely representative. Signals actually used may differ slightly to significantly from those of FIG. 2. As an example of signals that differ significantly from that of FIG. 2, the signals may be symbols in which multiple bits are encoded in a one cycle, less than a cycle, or more than a cycle. In some embodiments, more than one voltage may be altered with a symbol. In some embodiments, each transmit signal has the same voltage, while in other embodiments, they may have different voltages. In some embodiments, the different components of a differential transmit signal have the same voltages, while in other embodiments, the different components may have a different voltage.

The following are some possibilities of operation of chip A during initiation mode. Under one approach, voltage control circuitry 42 starts with the transmit signals on interconnects 16 having the lowest available voltage (V1 in the example of FIG. 2). If evaluation circuitry 40 determines that the transmit signals were usable by chip B, voltage control circuitry continues to have the transmit signals have the lowest voltage (V1) in ordinary operation mode. If it is determined that the transmit signals with the lowest voltage were not usable by chip B, voltage control circuitry 42 raises the voltage to the next higher voltage (V2 in the example of FIG. 2). If evaluation circuitry 40 determines that the transmit signals were usable by chip B, voltage control circuitry continues to have the transmit signals have the next higher voltage (V2) in ordinary operation mode. If it is determined that the transmit signals with the next higher voltage (V2) were not usable by chip B, voltage control circuitry 42 raises the voltage to the next higher voltage (V3 in the example of FIG. 2). The process repeats until there is a usable voltage or until it is determined that none of the voltages are usable.

Under another approach, voltage control circuitry 42 starts with the transmit signals on interconnects 16 having the highest available voltage (V6 in the example of FIG. 2). If the transmit signal at that voltage is determined by evaluation circuitry 40 to be usable by chip B, then the voltage of the transmit signals are lowered to the next lower voltage (V5 in the example of FIG. 2). If they are usable by chip B at that voltage, then the voltage is further lowered (to V4 in the example of FIG. 2) and so forth as long as the transmit signals were determined to be usable until the lowest available voltage (V1 in the example of FIG. 2) is used. If at any time evaluation circuitry 40 determines that the transmit signals were not usable by chip B, voltage control circuitry 42 can raise the voltage to the next higher voltage (which was already determined to be usable) and use this voltage in ordinary operation mode.

Under yet another approach, voltage control circuitry 42 may start at an intermediate voltage (for example, V3) and work down to lower voltages as long as the transmit signals are determined to be usable or work up until there is a usable voltage. Still other approaches may be used. As noted, to be conservative, chip A might pick a voltage other than the lowest. For example, chip A might be the next to the lowest available voltage for the transmit signals. In some embodiments, for whatever reason, chip A may decide not to go below a certain voltage even if lower voltages are available.

There are at least three approaches for evaluation circuitry 40 to determine whether transmit signals on interconnects 16 were usable by chip B. (1) Determine whether looped back signals from chip B match representations of the transmit signals either exactly or within an acceptable level. (2) Determine whether a number of retry requests received is within an acceptable level. (3) Determine whether chip B sends a test passed or failed signal. Each of these approaches is discussed as follows. Stated another way, there are at three types of feedback signals (looped back signals, retry signals, and test passed or failed signals).

In some embodiments, the chips will be able to use only one of these approaches (or yet another approach that is different than the three), while in other embodiments, the chips will be able to use more than one of these approaches. For example, in some embodiments, the loopback technique might be used during initiation mode, while the retry requests may causes a change during ordinary operation mode. In other embodiments, the techniques are used only during initiation mode.

1. LOOPBACK. In some embodiments, chips A and B can enter a loopback mode in which some or all of the received signals VinB1+, VinB1− . . . VinBN+, VinBN− from interconnects 16 are retransmitted back to chip A. In FIG. 1, the retransmitted (looped back) signals are sent through one or more of transmitters TXB1 . . . TXBM to corresponding ones of interconnects 18 and receivers RXA1 . . . RXAM and evaluation circuitry 40. Evaluation circuitry 40 can then compare at least a portion of the received looped back signals to a representation of at least a corresponding portion of the transmit signals. (As examples, the representations can be hardwired or stored bits.) If there is a match, then it is concluded that at least those transmit signals are usable by chip B. However, in some embodiments, chip A may transmit a variety of transmit signals with different test patterns at a particular voltage (or slight variations around the particular voltage) before evaluation circuitry 40 will determine whether the transmit signals at a particular voltage are usable by chip B. In some embodiments, any mismatches will result in a conclusion that the transmit signals are not usable by chip B. In other embodiments, a certain number of mismatches may be acceptable. An example of where some mismatches may be acceptable is in a system in which chip A can respond to retry requests from chip B by resending the transmit signals (discussed below). Further, chip A may retry a voltage for which there is a determination of non-usability to determine if it really unusable.

There are a variety of ways in which the loopback can be initiated and performed. For example, a loopback initiating command can be sent on one or more of interconnects 16. The loopback can continue until a completion command. In different embodiments, processing circuitry 34 may retransmit all the transmitted signals (including the loopback command) or less than all the transmitted signals (for example, excluding the loopback command) and might or might not add additional signals such as a header to the looped back signals.

When it is said that a signal is looped back, it is understood that voltage and/or timing characteristics of a signal from chip A that is being looped back may be to some extent modified by circuitry in chip B (for example, by processing circuitry 34 or one or more of transmitters TXB1 . . . TXBM). Accordingly, the voltage and timing of the signals returning from chip B are not necessarily identical to the signals from chip A to chip B.

2. RETRY REQUEST. In some embodiments, processing circuitry 34 has the ability to detect if the received transmit signals from interconnects 16 have some errors in them and to request that chip A retransmit the transmit signals. This is referred to as a retry request. In response to the retry request, chip A can resend the transmit signal to chip B. In other embodiments, chip B does not have the ability to detect errors or to request retries. The retry requests can be communicated through one or more of transmitters TXB1 . . . TXBM and corresponding ones of the interconnects 18. In some embodiments, evaluation circuitry 40 may allow a particular number of retry requests and still determine that the transmit signals are usable by chip B (although in some embodiments there may be zero tolerance for retry requests). The particular number may vary depending on the nature of the transmit signals or other factors. Chip A may retry a voltage for which there is a determination of non-usability. Further, chip A may transmit a variety of transmit signals with different test patterns at a particular voltage (or slight variations around the particular voltage) before evaluation circuitry 40 will determine whether the transmit signals at a particular voltage are usable by chip B.

In deciding whether the number of retry requests is within an acceptable level, the number can be compared to a threshold. Depending on the embodiment or situation, the acceptable level may be less than the threshold or less than or equal to the threshold.

In different embodiments, monitoring retry requests may occurring only during initiation mode, only during ordinary operation mode, or both during initiation mode and ordinary operation mode.

3. TEST PASSED OR FAILED SIGNALS. In some embodiments, chip B expects particular test patterns from chip A during initiation mode. Processing circuitry 34 of chip B can compare at least a portion of the test patterns it receives from chip A to representations of the test pattern, or use some other technique to determine if the received test patterns are correct. In some embodiments, chip B sends a message through one or more of transmitters TXB1 . . . TXBM to chip A indicating that either than the test has passed or a message indicating the test has failed. The test passed message and test failed message may be different states of the same signal. The test patterns may be repeated to give assurance of usability.

Approaches other than these three could be used.

In FIG. 1, serial decoupling capacitors C1-1, C2-1 . . . C1-N, C2-N, and C3-1, C4-1 . . . C3-M and C4-M are in series in interconnects 30-1, 32-1 . . . 30-N, 32-N, and 36-1, 38-1 . . . 36-M, 38-M, respectively. The decoupling capacitors block direct current (DC) voltage but pass higher frequency signals. Decoupling capacitors C1-1, C2-1, C1-N, and C2-N are illustrated as being on the interconnect externally from the chip, whilst decoupling capacitors C3-1, C4-1, C3-M, and C4-M are illustrated as being in the chip. However, each of the decoupling capacitors could be external or on the chips. Depending on the capacitance of the decoupling capacitors, it may be impractical to have a decoupling capacitor on die. For example, the decoupling capacitors may be about 75 nanofarads, although they may be more or less than that. The decoupling capacitors may be in the chip package, on a card supporting the chip, on the motherboard or elsewhere. The label 30-1 is intended to be the label for the interconnect on each side of decoupling capacitor C1-1. Decoupling capacitors may be useful where chips A and B have different voltages. Some embodiments do not include decoupling capacitors.

In FIG. 1, chip A include ports 20-1, 22-1 . . . 20-N, 22-N. The ports are chip interfaces. Examples of the ports include die pads, but the ports may be other that die pads. Likewise, chip A includes ports 52-1, 54-1 . . . 52-M, 54-M and chip B includes ports 26-1, 28-1 . . . 26-N, 28-N and ports 48-1, 50-1 . . . 48-M, 50-M. In the example of FIG. 1, ports 20-1, 22-1 . . . 20-N, 22-N and 48-1, 50-1 . . . 48-M, 50-M are output ports and ports 26-1, 28-1 . . . 26-N, 28-N and ports 52-1, 54-1 . . . 52-M, 54-M are input ports, but ports could be bi-directional. Chips A and B may be chips on a card(s), motherboard(s), or other substrate(s). Additional chips (not shown) may also be coupled to chips A and/or B. The interconnects illustrated represent one or more of the following: slots, fingers, traces, and other conductive materials that may be present between the chips.

Figure 3:
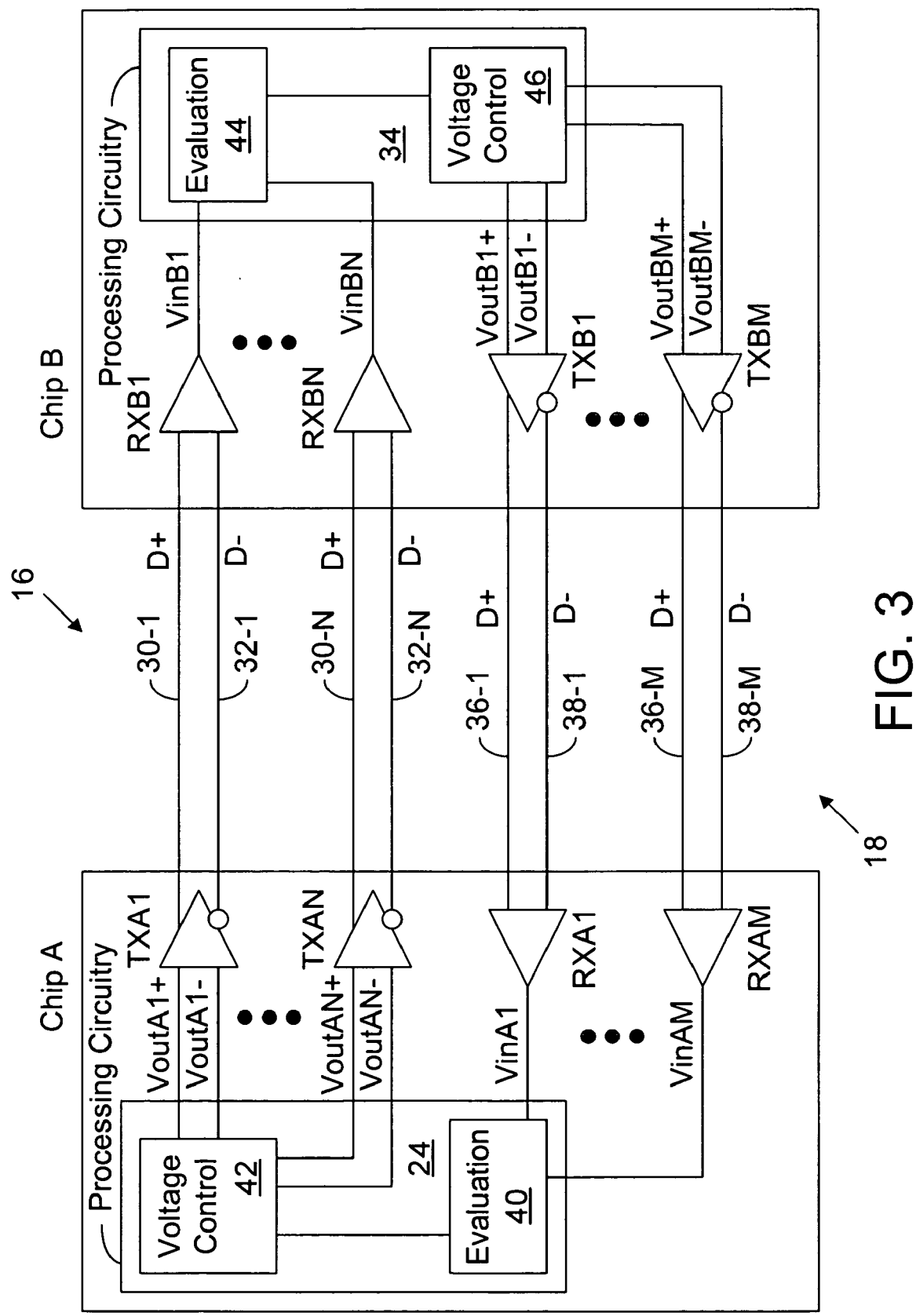
FIG. 3 is a schematic block diagram representation of a system according to some embodiments of the inventions.

As shown in FIG. 1, receivers RXB1 . . . RXBN provide the received signals as differential signals VinB1+, VinB1− . . . VinBN+, VinBN− to processing circuitry 34. By contrast in FIG. 3 receivers RXB1 . . . RXBN and receivers RXA1 . . . RXAM convert the differential signals to signal ended signals. (In other embodiments, the receivers could convert signal ended to differential signals.) FIG. 3 also shows interconnects 16 and 18 without serial capacitors. Further, in FIG. 3, processing circuitry 34 includes evaluation circuitry 44 and voltage control circuitry 46, whereas in FIG. 1 the contents of processing circuitry 34 is unspecified. In the case of FIG. 3, chip B can go through an initiation mode like that of chip A and determine the voltages at which to send transmit signals over interconnects 18 during ordinary operating mode. In this case, chip A could loopback signals, send retry requests, send test passed or failed signals to chip B or provide other ways to provide feedback to chip B. Note that in signals VinB1 and VinBN may be received by circuitry (not shown) other than evaluation circuitry 44.

Figure 4:
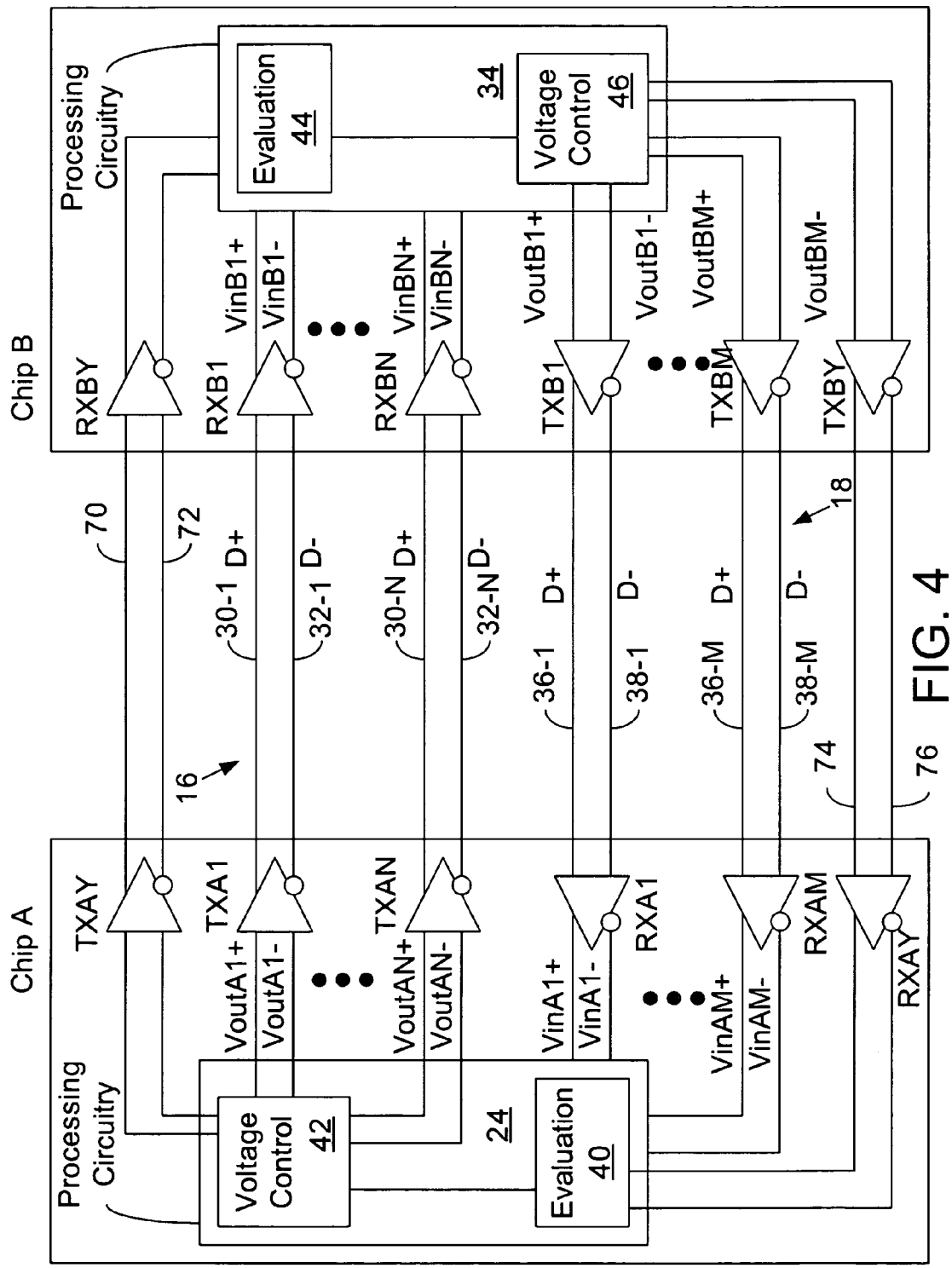
FIG. 4 is a schematic block diagram representation of a system according to some embodiments of the inventions.

FIG. 4 illustrates yet another technique for providing feedback from chip A to B. In FIGS. 1 and 3, feedback signals are passed through one or more of interconnects 18. Interconnects 16 and 18 may be referred to as inband interconnects. By contrast, in FIG. 4, feedback signals (for example, loopback signals, retry requests, or test passed or failed signals) from chip B to chip A may be passed through a sideband transmitter TXBY, sideband interconnect 74, 76 and sideband receiver TXAY to evaluation circuitry 40. Likewise, feedback signals from chip A to chip B may be passed through sideband transmitter TXAY, sideband interconnect 70, 72 and sideband receiver RXBY to evaluation circuitry 44. There may be more sideband transmitters, interconnects, and receivers. The sideband signals can be differential or single ended. In the system of FIG. 4, the transmit signals for which the voltages are determined may be transmitted on the inband interconnects 16 and 18 (as in FIGS. 1 and 3), or they may be transmitted on side back interconnects 70, 72 and 74, 76 of FIG. 4.

Figure 5:
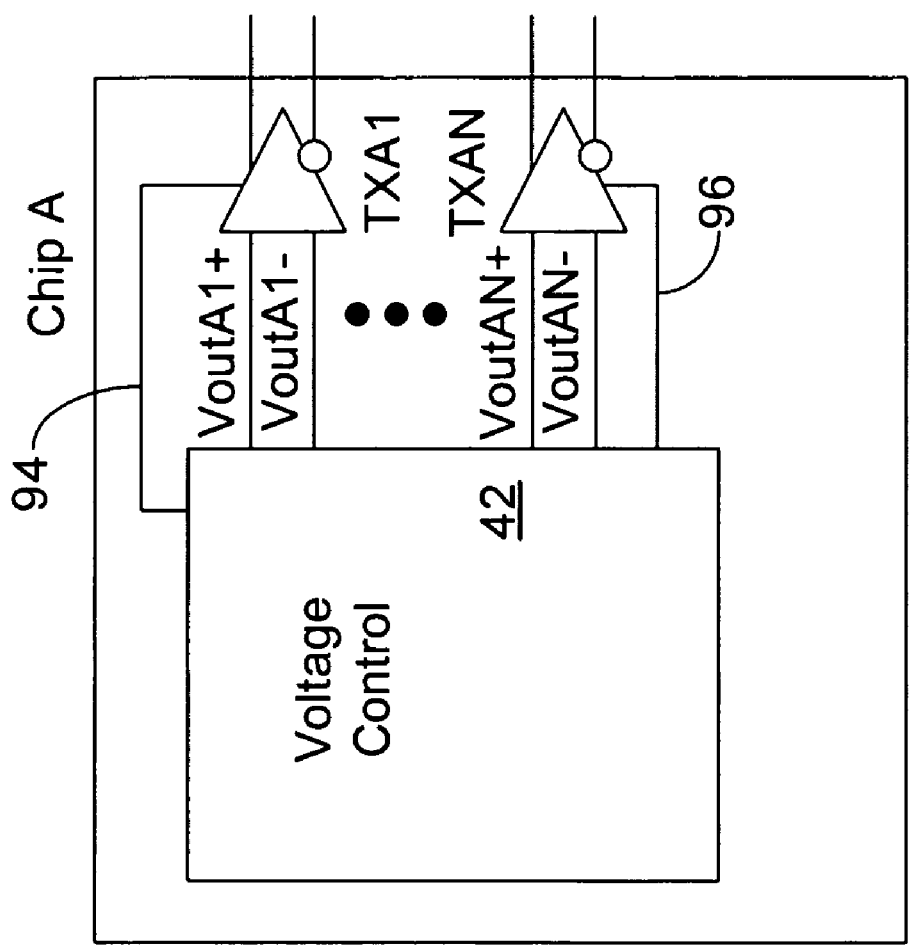
FIG. 5 is a schematic block diagram representation of some details of chip A of FIG. 1 according to some embodiments of the inventions.

In FIG. 1, the voltage of the transmit signals is set by voltage control circuitry 42 such that VoutA1+, VoutA1− have the voltage set before they are received by transmitters TXA1 . . . TXAN and the transmitters merely increase the drive strength at the set voltage. Alternatively, FIG. 5 illustrates that voltage control circuitry 42 may control transmitters TXA1 . . . TXAN through conductor(s) 94 . . . conductor(s) 96 so that transmitters TXA1 . . . TXAN sets the voltage of the transmit signals as well as provide the drive strength.

The transmitters, interconnects, and receivers may act as serial links. In some embodiments, the link includes lanes, where a lane is formed of interconnects between two opposite pairs of transmitters and receivers. For example, a lane might include interconnects 30-1, 32-1, 36-1, and 38-1, where interconnects 30-1 and 32-1 carry signals from chip A to chip B and interconnects 36-1 and 38-1 carry signals from chip B to chip A. However, the use of such lanes is not required. Processing circuitry 24 and 34 may be such that a loopback initiating command in any of the lanes causes all the lanes to loopback or some specified lanes in addition to the one containing the loopback initiating command. In some embodiments, loopback is initiated only for the lanes including the loopback initiating commands. In other embodiments, a command in one lane can initiate loopback for some or all lanes in the link. There may be different types of loopback initiating commands.

Figure 6:
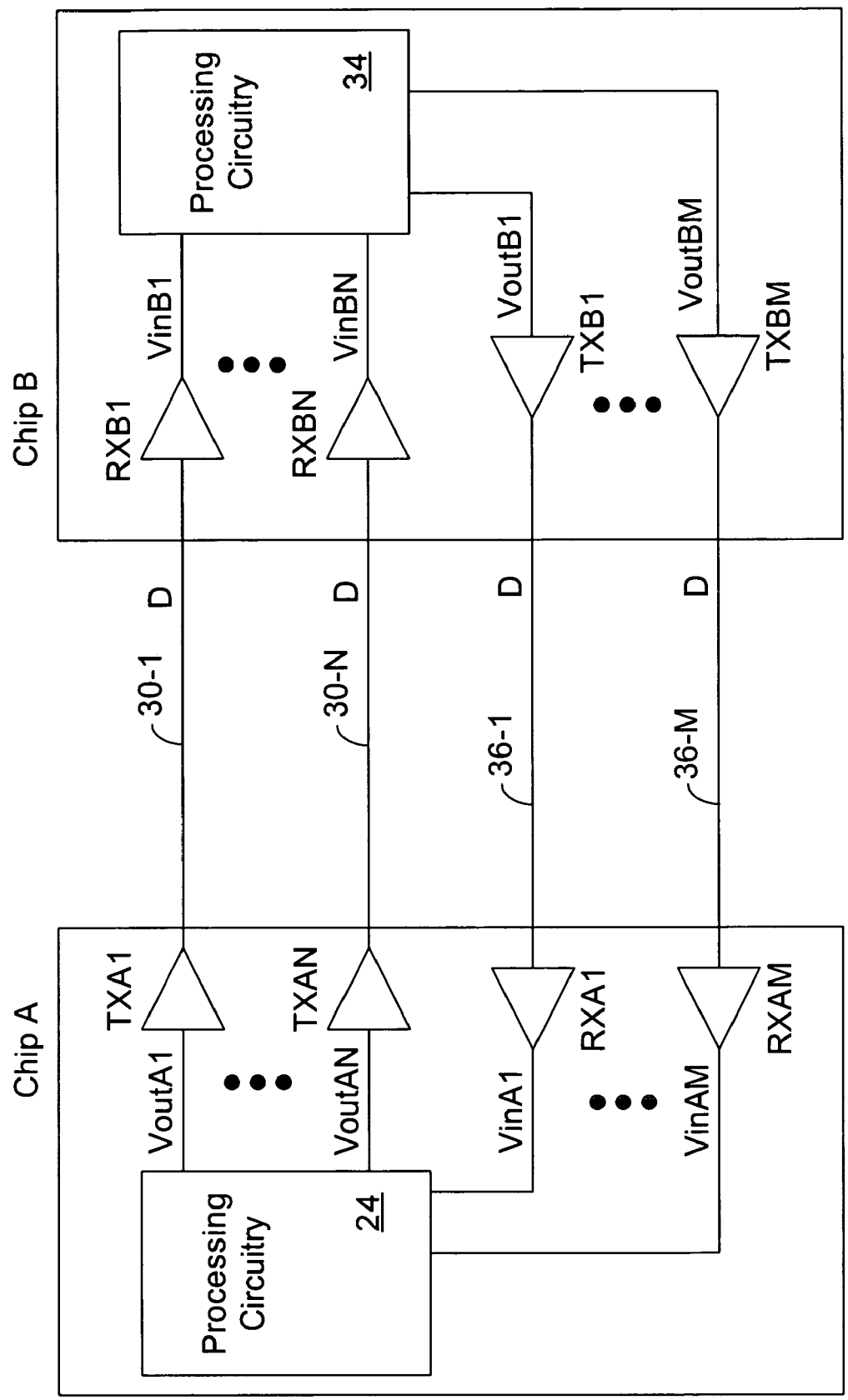
FIG. 6 is a schematic block diagram representation of a system according to some embodiments of the inventions.

FIG. 6 illustrates that single ended signals may be used for the interconnects rather than differential signals.

Figure 7:
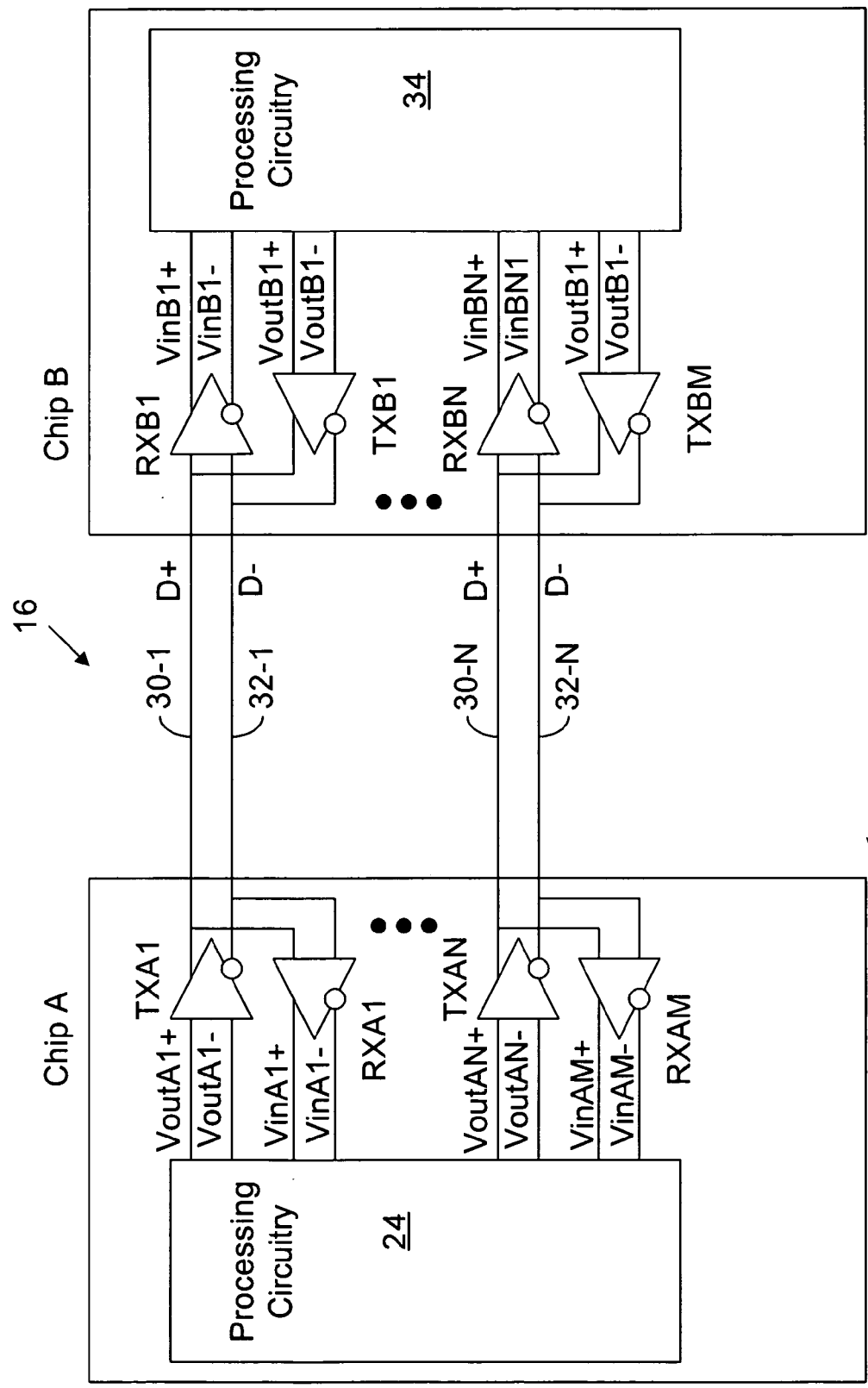
FIG. 7 is a schematic block diagram representation of a system according to some embodiments of the inventions.

FIG. 7 illustrate bi-directional interconnects. The bi-directional signal may be sequential or simultaneous. In the case sequential bidirectional signals, signals to be looped back and signals being looped back could be interspersed or completely sequential. In the case of simultaneous bi-directional signals, the interconnects could simultaneously carry transmit signals and feedback signals.

Figure 8:
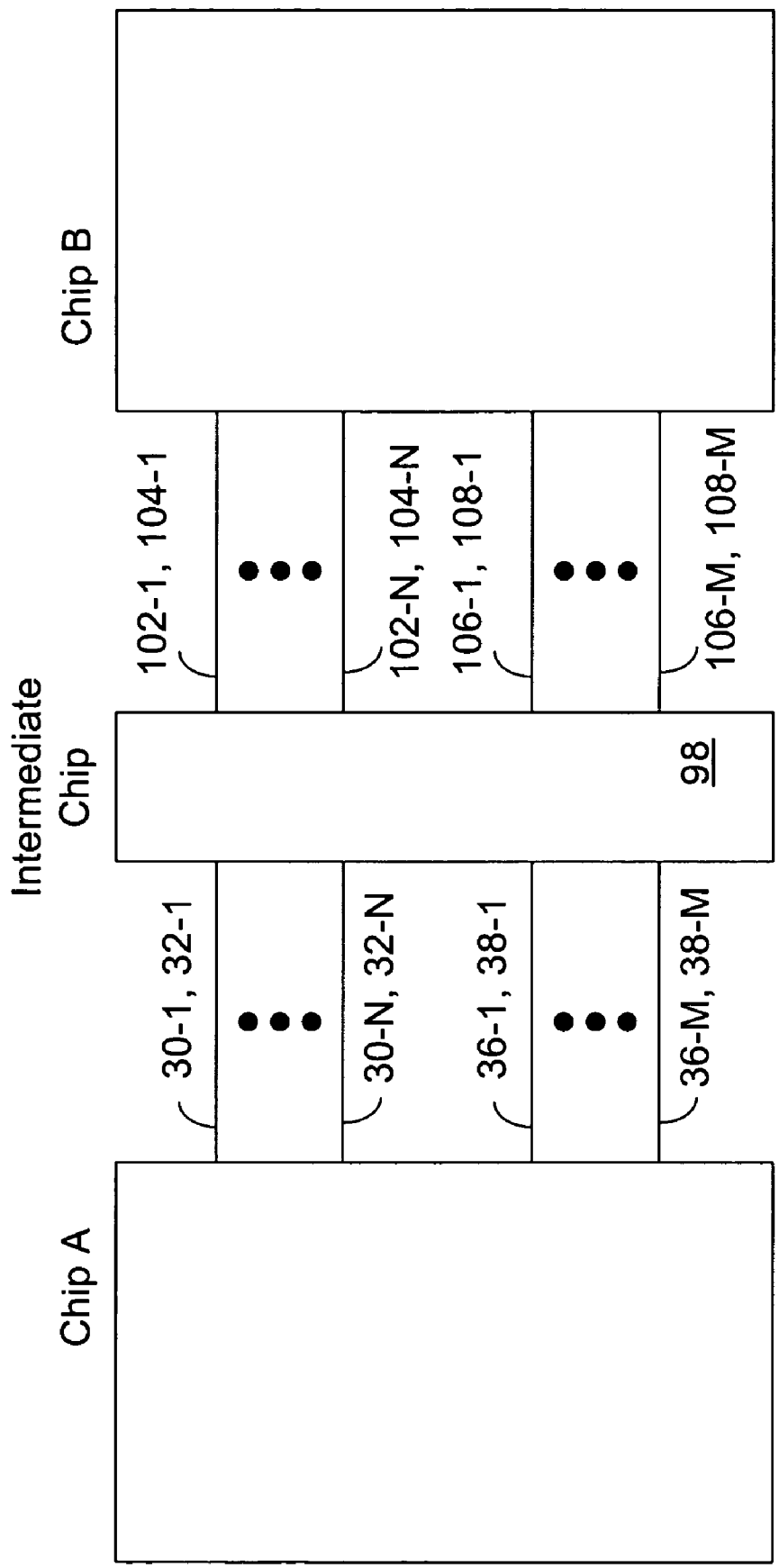
FIG. 8 is a schematic block diagram representation of a system according to some embodiments of the inventions.

FIG. 8 illustrates that there may be an intermediate chip 98 between chips A and B. Interconnects 102-1, 104-1 . . . 102-N, 104-N and 106-1, 108-1 . . . 106-M, 108-M carry differential signals, but they could be signal ended and/or bi-directional as discussed. The various features described in connection with the different figures may be mixed and matched in different embodiments.

Some embodiments of the invention are implemented so as to be compliant with a PCI Express specification, but that is not required. The invention may be implemented in a way that is not PCI Express compliant.

Chips A and B may be in computer system including desktop computer system, a server computer system, a mobile computer system, and an embedded computer system. Chips A and B may also be in communication systems that are in or that are not in a computer system. There may be additional circuitry not shown such as electrostatic discharge circuitry.

The transmitters may be of various types including voltage mode or current mode transmitters.

In some embodiments, there may be only one transmitter on chip A.

The signals are not restricted to any particular type of signaling. The signals may be, for example, be packetized or time multiplexed. In some embodiments, the signaling may be of the type in which the clock is recovered from the signals D+ and D− and used to provide a sampling clock in phase with data of the signals. The signals may be coded such as in 8b/10b coding.

The discussion above is described in terms of the voltage of the transmit signals being changed to find a reduced power. However, in some embodiments, the power may be reduced by keeping a constant voltage and reducing the current. The techniques described above could be used for such a system.

In some embodiments, the transmitters and receivers do not invert the signals they receive, but in other embodiments, they could invert them. An embodiment is an implementation or example of the inventions. Reference in the specification to "an embodiment," "one embodiment," "some embodiments," or "other embodiments" means that a particular feature, structure, or characteristic described in connection with the embodiments is included in at least some embodiments, but not necessarily all embodiments, of the inventions. The various appearances of "an embodiment," "one embodiment," or "some embodiments" are not necessarily all referring to the same embodiments.

If the specification states a component, feature, structure, or characteristic "may", "might", or "could" be included, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

The inventions are not restricted to the particular details described herein. Indeed, many other variations of the foregoing description and drawings may be made within the scope of the present inventions. Accordingly, it is the following claims including any amendments thereto that define the scope of the inventions.

What is claimed is:

1. A chip comprising: transmitters to provide transmit signals to chip interfaces, wherein the chip interfaces are to make the transmit signals available external to the chip; voltage control circuitry to control voltages of the transmit signals; receivers to receive external signals from another chip, wherein the external signals include looped back signals of at least portions of the transmit signals and are provided by the other chip to the receivers; and evaluation circuitry to determine whether the transmit signals were usable by the other chip based on an evaluation of at least one of the received external signals and to provide a usability indicating signal to the voltage control circuitry indicative of whether the transmit signals were usable by the other chip and wherein the evaluation circuitry compares at least portions of the looped back signals to at least partial representations of the transmit signals.

2. The chip of claim 1, wherein if the usability indicating signal indicates the transmit signals were usable by the other chip, the voltage control circuitry lowers voltages of subsequent transmit signals.

3. The chip of claim 1, wherein if the usability indicating signal indicates the transmit signals were not usable by the other chip, the voltage control circuitry raises voltages of subsequent transmit signals to voltages of previous transmit signals that were determined to be usable by the other chip.

4. The chip of claim 1, wherein the evaluation circuitry and the voltage control circuitry operate to find a lowest available usable voltage for the voltages of the transmit signals.

5. The chip of claim 1, wherein if the at least one of the received external signals includes a retry request, the evaluation circuitry determines whether a number of received retry requests is within an acceptable level.

6. The chip of claim 5, wherein if the number of received retry signals is not within the acceptable level, the usability indicating signal indicates that the transmit signals were not usable by the other chip.

7. The chip of claim 5, wherein the received the number of retry signals must be within an acceptable level for a variety of test patterns for the evaluation circuitry to conclude that the transmit signals were usable.

8. The chip of claim 1, wherein the evaluation is done during an initialization mode and then not repeated until another initialization.

9. The chip of claim 1, wherein the evaluation is done during an initialization mode and the initialization mode can be entered by one or more of the following: the chip being first given power, a chip being reset, in response to a particular number of retry requests being received, a temperature exceeding a threshold, and a change in a power source.

10. The chip of claim 1, wherein the transmit signals are part of a test routine and the other chip determines whether the test routine is correct and provides a pass or fail signal as part of the external signals, and wherein the evaluation circuitry uses the pass or fail signal in determining whether the transmit signals were usable by the other chip.

11. The chip of claim 1, wherein the voltage control circuitry changes the voltages of the transmit signals prior to there being received by the transmitter.

12. The chip of claim 1, wherein the transmitter changes the voltages of the transmit signals under the control of the voltage control circuitry.

13. The chip of claim 1, wherein if any of the transmit signals are determined to have been unusable, then the voltages are changed for all of the transmit signals.

14. A chip comprising: a transmitter to provide a transmit signal to at least one chip interface, wherein each of the chip interfaces is to make the transmit signal available external to the chip; voltage control circuitry to control a voltage of the transmit signal; a receiver to receive an external signal from another chip, wherein the external signals include looped back signals of at least portions of the transmit signals and are provided by the second chip to the receivers,; and evaluation circuitry to determine whether the transmit signal was usable by the other chip based on an evaluation of the received external signal and to provide a usability indicating signal to the voltage control circuitry indicative of whether the transmit signal was usable by the other chip and wherein the evaluation circuitry compares at least portions of the looped back signals to at least partial representations of the transmit signals.

15. The chip of claim 14, wherein if the usability indicating signal indicates the transmit signal was usable by the other chip, the voltage control circuitry lowers the voltage of a subsequent transmit signal.

16. The chip of claim 14, wherein if the usability indicating signal indicates the transmit signal was not usable by the other chip, the voltage control circuitry raises voltages of a subsequent transmit signal to a voltage of a previous transmit signals that was determined to have been usable by the other chip.

17. The chip of claim 14, wherein the evaluation circuitry and the voltage control circuitry operate to find a lowest available usable voltage for the voltages of the transmit signals.

18. The chip of claim 14, wherein the external signal may include one of the following: a looped back signal, a retry request, or a pass or fail signal.

19. A system comprising: first and second interconnects; first and second chips coupled by the first and second interconnects; wherein the first chip includes: transmitters to provide transmit signals to first interconnects; voltage control circuitry to control voltages of the transmit signals; receivers to receive external signals from the second chip, wherein the external signals include looped back signals of at least portions of the transmit signals and are provided by the second chip to the receivers; and evaluation circuitry to determine whether the transmit signals were usable by the second chip based on an evaluation of at least one of the received external signals and to provide a usability indicating signal to the voltage control circuitry indicative of whether the transmit signals were usable by the second chip and wherein the evaluation circuitry compares at least portions of the looped back signals to at least partial representations of the transmit signals.

20. The system of claim 19, wherein if the usability indicating signal indicates the transmit signals were usable by the second chip, the voltage control circuitry lowers voltages of subsequent transmit signals.

21. The system of claim 19, wherein if the usability indicating signal indicates the transmit signals were not usable by the second chip, the voltage control circuitry raises voltages of subsequent transmit signals to voltages of previous transmit signals that were determined to be usable by the second chip.

22. The system of claim 19, wherein the evaluation circuitry and the voltage control circuitry operate to find a lowest available usable voltage for the voltages of the transmit signals.

23. The system of claim 19, wherein if the at least one of the received external signals includes a retry request, the evaluation circuitry determines whether a number of received retry requests is within an acceptable level.

24. The system of claim 19, wherein the evaluation is done during an initialization mode and then not repeated until another initialization.

25. The system of claim 19, wherein the evaluation is done during an initialization mode and the initialization mode can be entered by one or more of the following: the first chip being first given power, a first chip being reset, in response to a particular number of retry requests being received, a temperature exceeding a threshold, and a change in a power source.

26. The system of claim 19, wherein the transmit signals are part of a test routine and the second chip determines whether the test routine is correct and provides a pass or fail signal as part of the external signals, and wherein the evaluation circuitry uses the pass or fail signal in determining whether the transmit signals were usable by the second chip.

* * * * *